United States Patent
Xiao et al.

(10) Patent No.: US 12,527,185 B2
(45) Date of Patent: Jan. 13, 2026

(54) DISPLAY PANEL HAVING POWER SIGNAL MAIN LINE WITH WIDE INPUT END IN DISPLAY AREA

(71) Applicant: SHENZHEN CHINA STAR OPTOELECTRONICS SEMICONDUCTOR DISPLAY TECHNOLOGY CO., LTD., Guangdong (CN)

(72) Inventors: Pian Xiao, Guangdong (CN); Linjia Liu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 458 days.

(21) Appl. No.: 18/176,082

(22) Filed: Feb. 28, 2023

(65) Prior Publication Data

US 2024/0215349 A1  Jun. 27, 2024

(30) Foreign Application Priority Data

Dec. 27, 2022 (CN) .......................... 202211682777.1

(51) Int. Cl.
*H10K 59/131* (2023.01)
(52) U.S. Cl.
CPC .................. *H10K 59/131* (2023.02)
(58) Field of Classification Search
CPC ...................................................... H10K 29/131
See application file for complete search history.

(56) References Cited

U.S. PATENT DOCUMENTS

| | | | |
|---|---|---|---|
| 2004/0061694 A1* | 4/2004 | Noguchi | G09G 3/3266 345/204 |
| 2005/0029937 A1* | 2/2005 | Kim | H10K 59/131 313/506 |
| 2006/0001792 A1* | 1/2006 | Choi | H10K 59/88 257/E27.111 |
| 2006/0250083 A1* | 11/2006 | Oh | G09G 3/3208 313/500 |
| 2007/0096135 A1* | 5/2007 | Matsumoto | H10K 59/131 257/99 |
| 2008/0252203 A1* | 10/2008 | Lee | H10K 59/131 313/504 |
| 2017/0194593 A1* | 7/2017 | Ma | H10K 59/1315 |
| 2022/0199652 A1* | 6/2022 | Shang | H10K 59/131 |

* cited by examiner

*Primary Examiner* — Lex H Malsawma
(74) *Attorney, Agent, or Firm* — PV IP PC; Peter S. Stecher; Wei Te Chung

(57) ABSTRACT

A display panel is provided by the present application. The display panel includes a display area and a non-display area. The display panel includes a plurality of power signal lines. Each of the power signal lines includes a power signal input line arranged on the non-display area, a power signal main line and a plurality of power signal sub-lines arranged on the display area. The power signal input line is connected to the power signal main line. At least part of the power signal sub-lines are directly connected to the power signal main line. a width of an input end of the power signal main line is wider than a width each of the power signal sub-lines. The width of the input end of the power signal main line is increased by an embodiment, which can avoid the power signal main line damage due to large current.

20 Claims, 1 Drawing Sheet

DISPLAY PANEL HAVING POWER SIGNAL MAIN LINE WITH WIDE INPUT END IN DISPLAY AREA

BACKGROUND OF INVENTION

Field of Invention

The present application relates to a field of display technology, in particular to a display panel.

Description of Prior Art

With the development of semiconductor technology, manufacturing technology of light-emitting diode (LED) has become increasingly mature. A light-emitting diode display panel has become a development trend in the future. At present, major panel factories are increasing research and investment.

However, the light-emitting diode display panel is a luminous element of current-driven type. Direct-current (DC) signal is entered in a direct-current signal wiring. Input-end current of the DC signal wiring is too large, which will cause the input-end of the DC signal wiring to easily generate a large amount of heat and be easily damaged. A thin film transistor near the input-end of the DC signal wiring is prone to change switching performance in high temperature environments, so that display images of the display panel are not uniform.

SUMMARY OF INVENTION

A display panel is provided by embodiments of the present application. The display panel can solve a problem that an input-end of the DC signal wiring is easy to be damaged and generate a large amount of heat due to excessive input-end current of the current DC signal wiring, which makes the thin film transistor near the input-end of the DC signal wiring easy to change its switching performance under high temperature environment, thus making display images of the display panel uneven.

A display panel is provided by an embodiment of present application, including:
 a plurality of power signal lines, each of the power signal lines including:
  a power signal input line, arranged on a non-display area; and
  a power signal main line, arranged on a display area and connected to the power signal input line; and
  a plurality of power signal sub-lines, arranged on the display area and connected to the power signal main line;
 wherein a width of an input end of the power signal main line is wider than each of the power signal sub-lines.

Optionally, in some embodiments provided by the present application, the power signal line is a VDD signal line or a VSS signal line.

Optionally, in some embodiments provided by the present application, the power signal line is a first power signal line, the power signal input line is a first power signal input line, the power signal main line is a first power signal main line, and the power signal sub-lines are first power signal sub-lines; and
 the first power signal bus extends along a first direction, the first power signal sub-line directly connected to the first power signal main lines extends along a second direction crossing the first direction; and end of each of the first power signal sub-lines is directly connected to the first power signal main line, the first power signal main line is wider than the each of the first power signal sub-lines.

Optionally, in some embodiments provided by the present application, the power signal line is a second power signal line, the power signal input line is a second power signal input line, and the power signal main line is a second power signal main line, and the power signal sub-lines are second power signal sub-lines; and
 the second power signal main line extends along a second direction, the second power signal sub-lines directly connected to the second power signal main line extend along a first direction crossing the second direction, and the second power signal sub-lines directly connect to the second power signal main line are intersected with the second power signal main line, a width of an input end of the second power signal main line is wider than a width of each of the second power signal sub-lines, the width of the input end of the second power signal main line is wider than a width of other part of the second power signal main line.

Optionally, in some embodiments provided by the present application, the second power signal main line is intersected with N of the second power signal sub-lines, and the input end of the second power signal main line is an area where the second power signal main line connects an Mth the second power signal sub-line to a boundary between the display area and the non-display area, where N is an integer greater than 1, M is an integer ranging between 1 and 5, and M is less than or equal to N.

Optionally, in some embodiments provided by the present application, the power signal line is a second power signal line, the power signal input line is a second power signal input line, and the power signal main line is a second power signal main line, and the power signal sub-lines are second power signal sub-lines; and
 the second power signal main line extends along a second direction, the second power signal sub-lines directly connected to the second power signal main line extend along a first direction crossing the second direction, and the second power signal sub-lines directly connect to the second power signal main line are intersected with the second power signal main line, a width of an input end of the second power signal main line is wider than a width of each of the second power signal sub-lines, the width of the input end of the second power signal main line is wider than a width of other part of the second power signal main line.

Optionally, in some embodiments provided by the present application, the first power signal line is one of a VDD signal line and a VSS signal line, and the second power signal line is another one of the VDD signal line or the VSS signal line.

Optionally, in some embodiments provided by the present application, the second power signal main line is intersected with N of the second power signal sub-lines, and the input end of the second power signal main line is an area where the second power signal main line connects an Mth the second power signal sub-line to a boundary between the display area and the non-display area, where N is an integer greater than 1, M is an integer ranging between 1 and 5, and M is less than or equal to N.

Optionally, in some embodiments provided by the present application, the display panel further includes a driving pad, and the driving pad includes a plurality of pad terminals; and
 the first power signal input line is connected between the first power signal main line and a corresponding pad terminal, and the second power signal input line is connected between the second power signal main line and a corresponding pad terminal.

Optionally, in some embodiments provided by the present application, the display panel further includes a plurality of light-emitting elements, the light-emitting elements includes anodes and a cathode, and the light-emitting elements are of a current-driven type; and the first power signal sub-lines are the VDD signal line and are electrically connected to the anodes, and the second power signal sub-lines are the VSS signal line and are electrically connected to the cathode.

Advantageous

A display panel is provided by embodiment of the present application. The display panel includes a display area and a non-display area. The display panel includes a plurality of power signal lines. Each of the power signal lines includes a power signal input line arranged on the non-display area, a power signal main line and a plurality of power signal sub-lines arranged on the display area. The power signal input line is connected to the power signal main line. At least part of the power signal sub-lines are directly connected to the power signal main line. a width of an input end of the power signal main line is wider than a width each of the power signal sub-lines. The width of the input end of the power signal main line is increased by an embodiment, which can avoid the power signal main line damage due to large current. At the same time, the width of the input end of the power signal main line is large, which is convenient to heat dissipation, so as to avoid the temperature near the input end of a DC signal wiring of the display panel increases too much. To prevent a thin film transistor from changing the switching performance in high temperature environments, so that display images of the display panel are uniform.

BRIEF DESCRIPTION OF DRAWINGS

In order to illustrate the technical solutions in the embodiments of the present application more clearly, the following briefly introduces the drawings that are used in the description of the embodiments. Obviously, the drawings in the following description are only some embodiments of the present application. For those skilled in the art, other drawings can also be obtained from these drawings without creative effort.

In the above figures.

Figure 1:
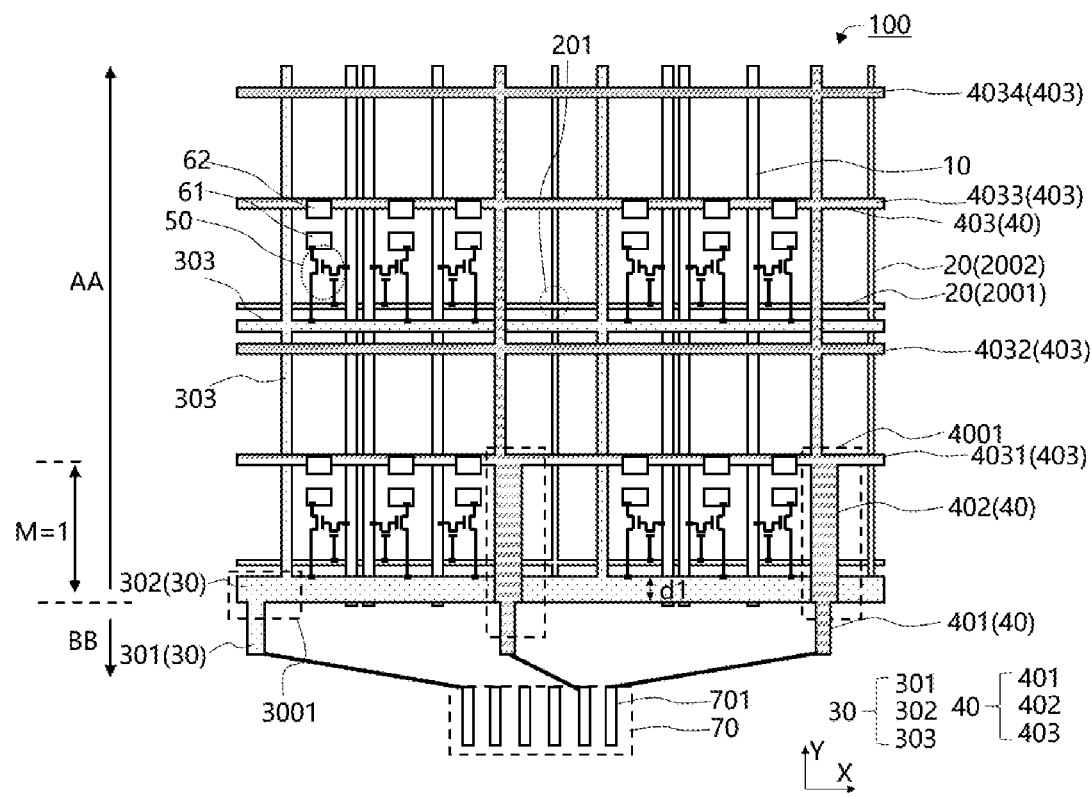
FIG. 1 is a first partial top view of a display panel provided by a first embodiment of the present application.

Display panel 100, display area AA, non-display area BB, first power signal line 30, the first power signal input line 301, the first power signal main line 302, the first power signal sub-line 303, second power signal line 40, the second power signal input line 401, the second power signal main line 402, the second power signal line 403, input terminal 3001 of first power signal main line 3001, input end of the second power signal main line 4001, first direction X, second direction Y, first connection electrode 61, second connection electrode 62, pixel drive circuit 50, data signal line 10, scanning signal line 20, display terminal 200.

DETAILED DESCRIPTION OF EMBODIMENTS

The technical solutions in the embodiments of the present application will be clearly and completely described below with reference to the drawings in the embodiments of the present application. Obviously, the described embodiments are only a part of the embodiments of the present application, but not all embodiments. Based on the embodiments in the present application, all other embodiments obtained by those skilled in the art without creative work should fall within the protection scope of the present application. In addition, it should be understood that the specific embodiments described herein are only used to illustrate and explain the present application, but not to limit the present application. In this application, unless otherwise stated, the directional words used such as "upper" and "lower" generally refer to the upper and lower sides of the device in actual use or working state, and specifically refer to the drawing direction in the drawings. "Inside" and "outside" indicate position relative to the outline of the device.

A display panel is provided by embodiment of the present application. The display panel includes a display area and a non-display area. The display panel includes a plurality of power signal lines. Each of the power signal lines includes a power signal input line arranged on the non-display area, a power signal main line and a plurality of power signal sub-lines arranged on the display area. The power signal input line is connected to the power signal main line. At least part of the power signal sub-lines are directly connected to the power signal main line. a width of an input end of the power signal main line is wider than a width each of the power signal sub-lines.

The following are detailed in detail. It should be noted that the description order of the following examples is not aimed at the preferred order of the embodiment.

Embodiment 1

Please refer to FIG. 1, FIG. 1 is a first partial top view of a display panel provided by a first embodiment of the present application.

A display panel 100 is provided by embodiment of the present application. The display panel 100 includes a display area AA and a non-display area BB. The display panel 100 includes a plurality of power signal lines. Each of the power signal lines includes a power signal input line arranged on the non-display area BB, a power signal main line and a plurality of power signal sub-lines arranged on the display area. The power signal input line is connected to the power signal main line. At least part of the power signal sub-lines are directly connected to the power signal main line. a width of an input end of the power signal main line is wider than a width each of the power signal sub-lines.

In some embodiments, the power signal line is a VDD signal or a VSS signal line.

The width of the input end of the power signal main line is increased by an embodiment, which can avoid the power signal main line damage due to large current. At the same time, the width of the input end of the power signal main line is large, which is convenient to heat dissipation, so as to avoid the temperature near the input end of a DC signal wiring of the display panel increases too much. To prevent a thin film transistor from changing the switching performance in high temperature environments, so that display images of the display panel are uniform.

In an embodiment, the power signal line is the first power signal line. The power signal input line is a first power signal input line. The power signal main line is a first power signal main line. The power signal sub-lines are first power signal sub-lines.

In an embodiment, the power signal line is the first power signal line 30. The power signal input line is a first power signal input line 301. The power signal main line is a first power signal main line 302. The power signal sub-lines are first power signal sub-lines 303. the first power signal main line 302 extends along a first direction X. The first power signal sub-lines 303 directly connected to the first power signal main line 302 extends along a second direction Y crossing the first direction X. Ends of the first power signal sub-lines 303 are directly connected to the first power signal main line 302. The first power signal main line 302 is wider than each of the first power signal sub-lines 303.

Furthermore, electrical signal in the first power signal line 30 is direct-current (DC) signal.

Specifically, the first power signal line 30 may include one or more first power signal input lines arranged on the non-display area BB 301.

Specifically, the first power signal line 30 includes one or more power signal main lines 302 arranged on the display area AA. Each of the first power signal main lines 302 connects a plurality of the first power signal sub-lines 303.

Specifically, the first power signal input line 301 is connected to the first power signal main line 302. The first power signal main line 302 is connected to a plurality of the first power signal sub-lines 303. That is, DC electrical signal enters the first power signal main line 302 through the first power signal input line 301, and then the DC electrical signal enters a plurality of the first power signal sub-lines 303 through the first power signal main line 302.

Specifically, the ends of the first power signal sub-lines 303 are directly connected to the first power signal main line 302. As shown in FIG. 1, the power signal sub-lines are a plurality of the first power signal sub-lines 303. A part of the first power signal sub-lines 303 extend in the first direction X. Another part of the first power signal sub-lines 303 extend along the second direction Y. The first power signal sub-lines 303 extending in the first direction X is connected to the first power signal sub-lines 303 extending in the second direction Y to provide corresponding electrical signals for the display panel. The ends of the first power signal sub-lines 303 extending in the second direction Y are directly connected to the first power signal main line 302.

Specifically, the width of the first power signal main line 302 is wider than the width of each of the first power signal sub-lines 303, which means that the width of the first power signal main line 302 is wider than the width of each of the first power signal sub-lines 303 extending along the first direction X, and the width of the first power signal main line 302 is wider than the width of each of the first power signal sub-lines 303 extending along the second direction Y.

Specifically, the first direction X intersects the second direction Y, as shown in FIG. 1, the first direction X and the second direction Y may be perpendicular.

Specifically, the first power signal main line 302 is located at the intersection or adjacent to the display area AA and the non-display area BB when the ends of the first power signal sub-lines 303 are directly connected to the first power signal main line 302.

It should be noted that the input end of the first power signal main line 302 refers to a region between a position where the first power signal main line 302 is connected to the first power signal input line 301 and a position where the first power signal main line 302 is connected to at least one first power signal 303. an input end 3001 of the first power signal main line is shown in a dotted box in FIG. 1. However, in this case, it is preferred that the width of the first power signal main line 302 is wider than the width of the first power signal sub-line 303.

The first power signal main line 302 is wider than the width of the first power signal sub-line 303 in an embodiment. The first power signal main line 302 can be prevented from being damaged due to excessive current by increasing the width of the first power signal main line 302. At the same time, the width of the first power signal main line 302 is large, which is convenient to heat dissipation, so as to avoid the temperature of the first power signal main line 302 in the display panel increases too much. To prevent the thin film transistor from changing the switching performance in the high temperature environment, so that the display images of the display panel are uniform.

It should be noted that electrical signals in wiring such as the first power signal main line 302 are all DC electrical signals, which are called the DC wiring.

Furthermore, the first power signal line is at least one of VDD signal line and VSS signal line in some embodiments.

Specifically, a light-emitting element in the display panel 100 is a current-driven type when a type of the display panel 100 is a light-emitting diode display panel (LED panel, or Min LED display panel, or Micro LED display panel) and an organic light-emitting display panel, which is provided with the VDD signal line and the VSS signal line. The VDD signal line and the VSS signal line are DC wirings. The first power signal line 30 is at least one of the VDD signal line and the VSS signal line. At least one the VDD signal main line in the VDD signal line and the VSS signal main line in the VSS signal line are configured as a structure of the first power signal main line 302.

Embodiment 2

Please continue to refer to FIG. 1, the embodiment is a same as or similar to the display panel in any one of the first embodiment, the similarities will not be repeated here, and only differences will be described here.

In an embodiment, the power signal line is a second power signal line 40. The power signal input line is a second power signal input line 401. The power signal main line is a second power signal main line 402. The power signal sub-lines are second power signal sub-lines 403. The second power signal main line 402 extends along a second direction Y. The second power signal sub-lines 403 directly connected to the second power signal main line 402 extends along a first direction X crossing the second direction Y. The second power signal sub-lines 403 directly connect to the second power signal main line 402 are intersected with the second power signal main line 402. a width of an input end 4001 of the second power signal main line 402 is wider than a width of each of the second power signal sub-lines 403. The width of the input end 4001 of the second power signal main line 402 is wider than width of other part of the second power signal main line.

Specifically, the second power signal sub-lines 403 directly connected to the second power signal main line 402 extends along a first direction X. As shown in FIG. 1, the power signal sub-lines are a plurality of the second power signal sub-lines 403. A part of the second power signal sub-lines 403 extend in the second direction Y. Another part of the second power signal sub-lines 403 extend along the first direction X. The second power signal sub-lines 403 extending in the first direction X are connected to the second power signal sub-lines 403 extending in the second direction Y to provide corresponding electrical signals for the display panel. The second power signal sub-lines 403 extending along the first direction X is intersected with the second power signal main line 402.

Specifically, the first direction X crosses the second direction Y. The first direction X is usually perpendicular to the second direction Y in the display panel.

In an embodiment, the width of the input end 4001 of the second power signal main line is wider than the width of each of the second power signal sub-lines 403. The width of the input end 4001 of the second power signal main line 402 is wider than the width of the other part of the second power signal main line. Current of the input end 4001 of the second power signal main line is shunted through the second power signal sub-lines 403 intersected with the second power signal main line 402. The second power signal main line 402 can be prevented from being damaged due to excessive current by increasing the width of the input end 4001 of the second power signal main line 402. The width of the input end 4001 of the second power signal main line 402 is large, which is convenient to heat dissipation, so as to avoid the temperature of the width of the input end 4001 of the second power signal main line 402 in the display panel increases too much. To prevent the thin film transistor from changing the switching performance in the high temperature environment, so that the display images of the display panel are uniform.

In an embodiment, the second power signal main line is intersected with N of the second power signal sub-lines. The input end of the second power signal main line is an area where the second power signal main line connects an Mth the second power signal sub-line to a boundary between the display area and the non-display area. Where N is an integer greater than 1, M is an integer ranging between 1 and 5, and M is less than or equal to N.

Specifically, along the second direction Y, the plurality of the second power signal sub-lines 403 intersected with the second power signal main line 402 from the end of the input end 4001 of the second power signal main line 402 are the 1th the second power signal sub-line 4031, the 2th the second power signal sub-line 4032, the 3th the second power signal sub-line 4033, the 4th the second power signal sub-line 4034, and the Mth the second power signal sub-line, successively. That is, FIG. 1 shows that the second power signal sub-lines 403 include the 1th the second power signal sub-line 4031, the 2th the second power signal sub-line 4032, the 3th the second power signal sub-line 4033, and the 4th the second power signal sub-line 4034.

Specifically, the input end 4001 of the second power signal main line 402 is an area where the second power signal main line connects the Mth the second power signal sub-line 403 to a boundary between the display area AA and the non-display area BB. The current of the other part of the second power signal main line 402 has been reduced, after the current in the second power signal main line 402 is shunted by the Mth the second power signal sub-line 403. the width of the other part of the input end 4001 of the second power signal main line is reduced to avoid the other part of the second power signal main line occupy too much layout space.

Furthermore, M is equal to 1.

Specifically, M is equal to 1. A value of M is reduced as much as possible, so that the other part of the input end 4001 of the second power signal main line can be avoided from occupying too much layout space. For example, when the display panel 100 is a transparent display panel, it can avoid the second power signal main line 402 blocking light, thereby improving the degree of transparency.

Specifically, M=1 and N=4 are illustrated in FIG. 1, but M and N can also be other values in the display panel, which will not be repeated here.

Embodiment 3

Please continue to refer to FIG. 1.

This embodiment is combination of embodiment 1 and embodiment 2. The first power signal line 30 in this embodiment is a same as the first power signal line 30 of any item in embodiment 1. The second power signal line 40 in this embodiment is a same as the second power signal line 40 of any item in embodiment 2.

In an embodiment, the power signal line is the first power signal line 30. The power signal input line is a first power signal input line 301. The power signal main line is a first power signal main line 302. The power signal sub-lines are first power signal sub-lines 303. the first power signal main line 302 extends along a first direction X. The first power signal sub-lines 303 directly connected to the first power signal main line 302 extends along a second direction Y crossing the first direction X. Ends of the first power signal sub-lines 303 are directly connected to the first power signal main line 302. The first power signal main line 302 is wider than each of the first power signal sub-lines 303. The power signal line is a second power signal line 40. The power signal input line is a second power signal input line 401. The power signal main line is a second power signal main line 402. The power signal sub-lines are second power signal sub-lines 403. The second power signal main line 402 extends along the second direction Y. The second power signal sub-lines 403 directly connected to the second power signal main line 402 extends along the first direction X crossing the second direction Y. The second power signal sub-lines 403 directly connect to the second power signal main line 402 are intersected with the second power signal main line 402. a width of an input end 4001 of the second power signal main line 402 is wider than a width of each of the second power signal sub-lines 403. The width of the input end 4001 of the second power signal main line 402 is wider than width of other part of the second power signal main line.

In an embodiment, the first power signal line 30 is a VDD signal line or a VSS signal line, and the second power signal line 40 is another one of the VDD signal line or the VSS signal line.

In an embodiment, the second power signal main line is intersected with N of the second power signal sub-lines. The input end of the second power signal main line is an area where the second power signal main line connects an Mth the second power signal sub-line to a boundary between the display area and the non-display area. Where N is an integer greater than 1, M is an integer ranging between 1 and 5, and M is less than or equal to N.

Figure 2:
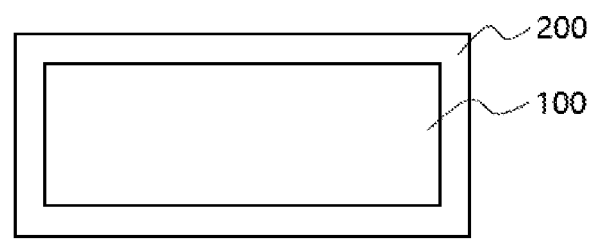
FIG. 2 is a schematic diagram of a display terminal 200 provided by a fourth embodiment of the present application.

In an embodiment, as shown in FIG. 2, the display panel 100 also includes a driving pad 70. The driving pad 70 includes a plurality of pad terminals 701. The first power signal input line 301 is connected to the first power signal main line 302 and a corresponding pad terminal 701. The second power signal input line 401 is connected between the second power signal main line 402 and a corresponding pad terminal 701.

In an embodiment, as shown in FIG. 1, the display panel 100 also includes a plurality of light-emitting elements (the figure is not signaled). The light-emitting elements include anodes and a cathode. The light-emitting elements are of a current-driven type. The first power signal sub-lines 303 are the VDD signal line and connected with the anodes. The second power signal sub-lines 403 are the VSS signal line and connected with the cathode.

Specifically, the first power signal sub-lines 303 are the VDD signal line, and the first power signal sub-lines 303 are input the electrical signal to the anode through a thin film transistor.

Specifically, the light-emitting elements are the light-emitting diode (LED) in a light emitting diode display panel or an electroluminescent device in an organic light-emitting display panel. FIG. 1 and FIG. 2 illustrate that the display panel 100 includes a first connection electrode 61 electrically connected to the first power signal sub-lines 303 and a second connection electrode 62 electrically connected to the second power signal sub-lines 403. The first power signal sub-lines 303 are the VDD signal line. The second power signal sub-lines 403 are the VSS signal line. The first connection electrode 61 is electrically connected to the anode of the light-emitting elements. The second connection electrode 62 is electrically connected to the cathode of the light-emitting elements, the first power signal line 30 and the second power signal line 40 provide power supply signals to drive the light-emitting elements to emit light. FIG. 1 shows that the first power signal main line 302 is multiplexed as one of the first power signal sub-lines 303.

Specifically, a pixel drive circuit 50 is illustrated in FIG. 1. The pixel drive circuit 50 is electrically connected to one of the first connection electrode 61 and the second connection electrode 62. A structure of the pixel drive circuit 50 is not limited here.

Furthermore, in some embodiments, the display panel 100 also includes a plurality of data signal lines 10. A width of an input end of one of the data signal line is a same as a width of other part of the data signal line.

The display panel 100 also includes the plurality of data signal lines 10 and the plurality of scanning signal lines 20 (gate signal lines). The data signal lines 10 and the scanning signal lines 20 are configured to transfer alternating signal, and current values of the data signal lines 10 and the scanning signal lines 20 are relatively small or the heat generates relatively small, and it does not need to be widened at input ends.

Embodiment 4

Please refer to FIG. 2, FIG. 2 is a schematic diagram of a display terminal 200 provided by a fourth embodiment of the present application.

A display terminal 200 is provided by an embodiment of the present application. The display terminal 200 includes a display panel 100 in any of the above embodiments.

Specifically, the display terminal 200 can show laptops, mobile phones, outdoor electronics display screens, etc., which is not limited here.

It should be noted that in the display panel 100 in the above embodiment, the light-emitting elements of the first power signal line 30 or/and the second power signal line 40 can be used as a light source in a backlight of the display panel.

It should be noted that in the display panel 100 in the above-mentioned examples, the light-emitting elements of the first power signal line 30 or/and the second power signal line 40 can be used as sub-pixels of a display image of the display panel.

It should be noted that two scanning signal lines 20 are illustrated in FIG. 1. One of the scanning signal lines 20 includes a first scanning signal sub-line 2001 extending along a first direction X and a second scanning signal sub-line 2002 extending along a second direction Y connected with each other. The different scanning signal lines 20 are not connected. An intersection of the first scanning signal sub-line 2001 and the second scanning signal sub-line 2002 is insulated through a bridging electrode. As shown in dotted line 201 in the FIG. 1, single-side signal input of the data signal line and the scanning signal line can be realized, and the use of drive chip can be reduced.

The display panel provided by the embodiments of the present application has been introduced in detail above, and the principles and implementations of the present application are described with specific examples. The description of the above embodiment is only used to help understand the method of the present application and its core idea. Further, those skilled in the art may change the specific implementation and application scope according to the idea of the application. In summary, the content of this specification should not be construed as a limitation to the present application.

What is claimed is:

1. A display panel, comprising:
   a plurality of power signal lines, each of the power signal lines comprising:
   a power signal input line, arranged on a non-display area; and
   a power signal main line, arranged on a display area and connected to the power signal input line; and
   a plurality of power signal sub-lines, arranged on the display area and connected to the power signal main line;
   wherein a width of an input end of the power signal main line is wider than each of the power signal sub-lines;
   wherein the power signal line is a first power signal line, the power signal input line is a first power signal input line, the power signal main line is a first power signal main line, and the power signal sub-lines are first power signal sub-lines; and
   the first power signal main line extends along a first direction, the first power signal sub-line directly connected to the first power signal main line extends along a second direction crossing the first direction; and an end of each of the first power signal sub-lines is directly connected to the first power signal main line, the first power signal main line is wider than each of the first power signal sub-lines.

2. The display panel according to claim 1, wherein the power signal line is a VDD signal line or a VSS signal line.

3. The display panel according to claim 1, wherein the power signal line is a second power signal line, the power signal input line is a second power signal input line, and the power signal main line is a second power signal main line, and the power signal sub-lines are second power signal sub-lines; and
   the second power signal main line extends along a second direction, the second power signal sub-lines directly connected to the second power signal main line extend along a first direction crossing the second direction, and the second power signal sub-lines directly connect to the second power signal main line are intersected with the second power signal main line, a width of an input end of the second power signal main line is wider than a width of each of the second power signal sub-lines, the width of the input end of the second power signal main line is wider than a width of other part of the second power signal main line.

4. The display panel according to claim 3, wherein the first power signal line is one of a VDD signal line and a VSS signal line, and the second power signal line is another one of the VDD signal line or the VSS signal line.

5. The display panel according to claim 4, wherein the second power signal main line is intersected with N of the second power signal sub-lines, and the input end of the second power signal main line is an area where the second power signal main line connects an Mth the second power signal sub-line to a boundary between the display area and the non-display area, where N is an integer greater than 1, M is an integer ranging between 1 and 5, and M is less than or equal to N.

6. The display panel according to claim 5, wherein the display panel further comprises a driving pad, and the driving pad comprises a plurality of pad terminals; and
the first power signal input line is connected between the first power signal main line and a corresponding pad terminal, and the second power signal input line is connected between the second power signal main line and a corresponding pad terminal.

7. The display panel according to claim 6, wherein the display panel further comprises a plurality of light-emitting elements, the light-emitting elements comprises anodes and a cathode, and the light-emitting elements are of a current-driven type; and
the first power signal sub-lines are the VDD signal line and are electrically connected to the anodes, and the second power signal sub-lines are the VSS signal line and are electrically connected to the cathode.

8. The display panel according to claim 7, wherein the display panel further comprises a first connection electrode connected to one of the anodes.

9. The display panel according to claim 7, wherein the display panel further comprises a second connection electrode connected to the cathode.

10. The display panel according to claim 3, wherein the first power signal main line is multiplexed as one of the first power signal sub-lines.

11. The display panel according to claim 1, wherein the first power signal main line is configured to transfer direct-current electrical signal.

12. The display panel according to claim 1, wherein the first power signal main line is multiplexed as one of the first power signal sub-lines.

13. The display panel according to claim 1, wherein the power signal line is a second power signal line, the power signal input line is a second power signal input line, and the power signal main line is a second power signal main line, and the power signal sub-lines are second power signal sub-lines; and
the second power signal main line extends along a second direction, the second power signal sub-lines directly connected to the second power signal main line extend along a first direction crossing the second direction, and the second power signal sub-lines directly connect to the second power signal main line are intersected with the second power signal main line, a width of an input end of the second power signal main line is wider than a width of each of the second power signal sub-lines, the width of the input end of the second power signal main line is wider than a width of other part of the second power signal main line.

14. The display panel according to claim 13, wherein the second power signal main line is intersected with N of the second power signal sub-lines, and the input end of the second power signal main line is an area where the second power signal main line connects an Mth the second power signal sub-line to a boundary between the display area and the non-display area, where N is an integer greater than 1, M is an integer ranging between 1 and 5, and M is less than or equal to N.

15. The display panel according to claim 1, wherein the display panel further comprises a plurality of data signal lines, a width of an input end of one of the data signal lines is a same as a width of other part of the one of the data signal line.

16. The display panel according to claim 1, wherein the data signal lines are configured to transfer alternating signal.

17. The display panel according to claim 1, wherein the display panel further comprises a plurality of scanning signal lines configured to transfer alternating signal.

18. A display panel, comprising:
a plurality of power signal lines, each of the power signal lines comprising:
a power signal input line, arranged on a non-display area; and
a power signal main line, arranged on a display area and connected to the power signal input line; and
a plurality of power signal sub-lines, arranged on the display area and connected to the power signal main line;
wherein a width of an input end of the power signal main line is wider than each of the power signal sub-lines;
wherein the power signal line is a first power signal line, the power signal input line is a first power signal input line, the power signal main line is a first power signal main line, and the power signal sub-lines are first power signal sub-lines;
the first power signal main line extends along a first direction, the first power signal sub-line directly connected to the first power signal main line extends along a second direction crossing the first direction; and an end of each of the first power signal sub-lines is directly connected to the first power signal main line, the first power signal main line is wider than each of the first power signal sub-lines;
wherein the power signal line is a second power signal line, the power signal input line is a second power signal input line, and the power signal main line is a second power signal main line, and the power signal sub-lines are second power signal sub-lines;
the second power signal main line extends along a second direction, the second power signal sub-lines directly connected to the second power signal main line extend along a first direction crossing the second direction, and the second power signal sub-lines directly connect to the second power signal main line are intersected with the second power signal main line, a width of an input end of the second power signal main line is wider than a width of each of the second power signal sub-lines, the width of the input end of the second power signal main line is wider than a width of other part of the second power signal main line.

19. The display panel according to claim 18, wherein the power signal line is a VDD signal line or a VSS signal line.

20. The display panel according to claim 18, wherein the second power signal main line is intersected with N of the second power signal sub-lines, and the input end of the second power signal main line is an area where the second power signal main line connects an Mth the second power signal sub-line to a boundary between the display area and the non-display area, where N is an integer greater than 1, M is an integer ranging between 1 and 5, and M is less than or equal to N.

* * * * *